(12) United States Patent
Zang

(10) Patent No.: US 11,522,005 B1
(45) Date of Patent: Dec. 6, 2022

(54) TRENCH FORMATION METHODS

(71) Applicant: OMNIVISION TECHNOLOGIES, INC., Santa Clara, CA (US)

(72) Inventor: Hui Zang, San Jose, CA (US)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 0 days.

(21) Appl. No.: 17/405,605

(22) Filed: Aug. 18, 2021

(51) Int. Cl.
H01L 31/0224 (2006.01)
H01L 27/146 (2006.01)

(52) U.S. Cl.
CPC .... H01L 27/14689 (2013.01); H01L 27/1463 (2013.01); H01L 27/14614 (2013.01)

(58) Field of Classification Search
None
See application file for complete search history.

(56) References Cited

U.S. PATENT DOCUMENTS

| 2007/0187734 A1* | 8/2007 | Adkisson | H01L 27/14689 257/E31.038 |
| 2010/0025800 A1* | 2/2010 | Kim | H01L 27/14634 257/E31.124 |
| 2015/0255400 A1* | 9/2015 | Chou | H01L 27/1463 438/424 |
| 2015/0372034 A1* | 12/2015 | Chen | H01L 27/14614 257/334 |
| 2016/0343752 A1* | 11/2016 | Tsai | H01L 27/14638 |
| 2018/0166293 A1* | 6/2018 | Tsai | H01L 21/3081 |
| 2019/0139997 A1* | 5/2019 | Chiang | H01L 27/14689 |
| 2020/0266150 A1* | 8/2020 | Kim | H01L 21/76877 |

* cited by examiner

Primary Examiner — Ali Naraghi
(74) Attorney, Agent, or Firm — Christensen O'Connor Johnson Kindness PLLC

(57) ABSTRACT

Methods of forming trench structures of different depths in a semiconductor substrate are provided. A first mask forming a first opening and a second opening is provided on the semiconductor substrate. The semiconductor substrate is etched through the first and second openings, thereby forming a first trench and a second trench. Trench structure material is deposited in the first and second trenches, thereby forming first and second trench structures. A second mask is provided on the first mask, wherein the second mask covers the first opening and has a third opening superimposed over the second opening of the first mask. The second trench structure is etched through the second opening of the first mask and through the third opening of the second mask.

20 Claims, 13 Drawing Sheets

TRENCH WIDTH PLANE

TRENCH WIDTH PLANE

TRENCH FORMATION METHODS

BACKGROUND

In pixel architecture, it is often advantageous to bury a photodiode deep within a semiconductor substrate in order to reduce the pixel size and to isolate the photodiode from other pixel elements. A vertical transfer gate is provided to transfer charge carriers from the photodiode to other pixel elements, e.g., a floating diffusion. Additionally, an isolation structure such as a shallow trench isolation structure is often provided to isolate the photodiode from other pixel elements, e.g., one or more pixel transistors.

According to known methods, forming the vertical transfer gate and the isolation structure on the same semiconductor substrate requires a manufacturing process with at least two critical masks, e.g., a first hard mask with a critical dimension of the isolation structure, and a second hard mask with a critical dimension of the vertical transfer gate. Such processes are costly and time consuming.

Accordingly, there is a need for improved methods of manufacturing pixels and image sensors.

BRIEF DESCRIPTION OF THE SEVERAL VIEWS OF THE DRAWINGS

Non-limiting and non-exhaustive embodiments of the present invention are described with reference to the following figures, wherein like reference numerals refer to like parts throughout the various views unless otherwise specified.

Figure 1:
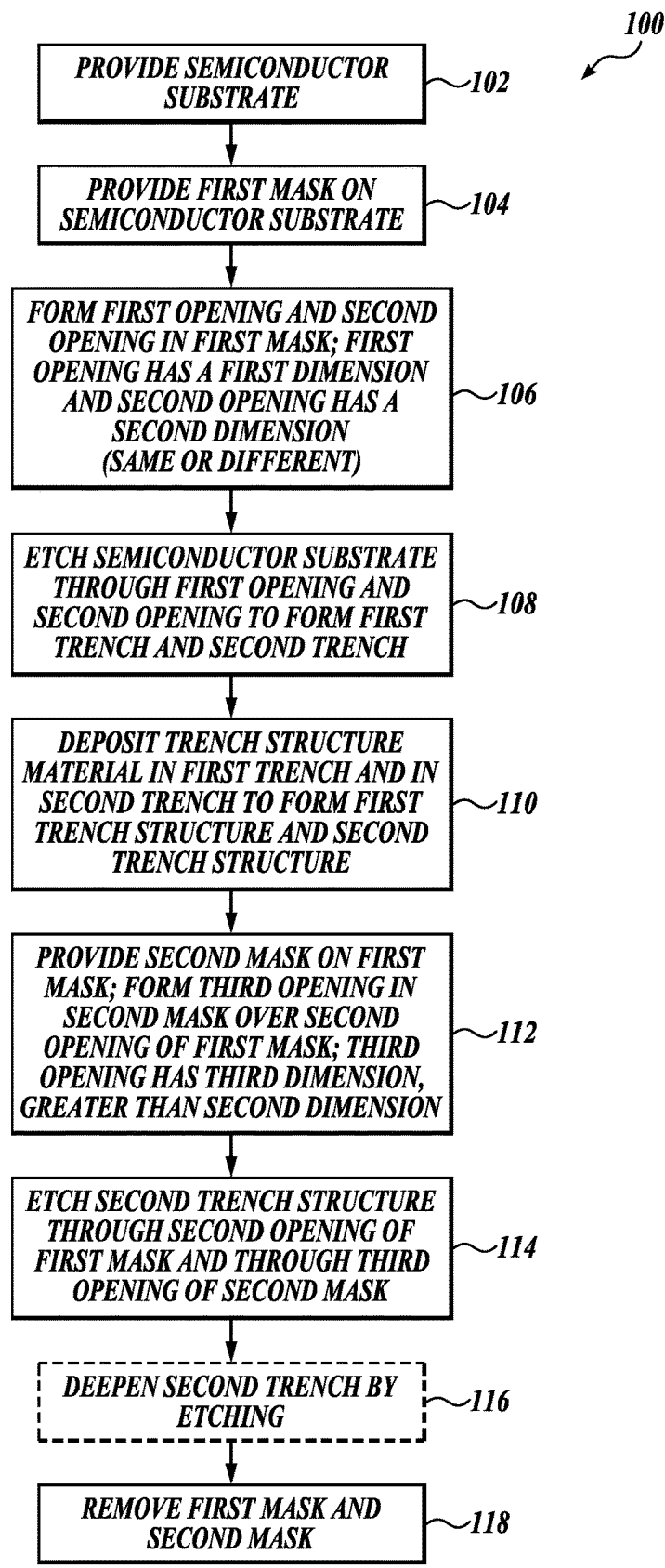
FIG. 1 is a schematic flow chart of a method of trench formation in accordance with the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present inventions. In addition, common but well-understood elements that are useful or necessary in a commercially feasible embodiment are often not depicted in order to facilitate a less obstructed view of these various embodiments of the present invention.

DETAILED DESCRIPTION

In an aspect, the present disclosure provides methods of forming pixels and image sensors, such as Complementary Metal Oxide Semiconductor (CMOS) image sensors. More generally, the present disclosure also provides methods of forming a vertical transfer gate and an isolation structure (e.g., a shallow trench isolation structure or a deep trench isolation structure) in a semiconductor substrate. More generally still, the present disclosure provides methods of forming at least two trenches with different depths in a semiconductor substrate.

In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "In some embodiments" or "in an embodiment" in various places throughout this specification are not necessarily all referring to the same example. Furthermore, any particular steps, features, structures, and/or characteristics of any embodiments may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

To facilitate understanding, the present disclosure describes methods in the context of CMOS image sensors. However, it shall be appreciated that the present disclosure shall not be limited to methods of manufacturing CMOS image sensors, but may be applied to non-CMOS image sensors.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, an epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

This disclosure refers to a number of terms with respect to different embodiments (including apparatuses and methods). Terms having alike names have alike meanings with respect to different embodiments, except where expressly noted. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 introduces a simplified flow chart of methods of forming trenches in a semiconductor substrate according to the teachings of the present disclosure. In some embodiments, the methods are a portion of methods of forming an isolation structure (such as a deep trench isolation structure or a shallow trench isolation structure) and a vertical transfer gate in the semiconductor substrate within an active region of a pixel array of an image sensor. The general methods are introduced briefly below, and detailed variations of the general methods are described below with respect to FIG. 2A-FIG. 2I and FIG. 3A-FIG. 3I.

In step 102, a semiconductor substrate is provided, such as a single crystal substrate, semiconductor on insulator (SOI) substrates, doped silicon bulk substrate, an epitaxial film on semiconductor (EPI) substrate, and the like. In some embodiments, the semiconductor substrate may be a pre-processed semiconductor substrate and has one or more layers, doped regions, or components formed thereon.

In step 104, a first mask (e.g., a hard mask) is provided on the semiconductor substrate. In one embodiments, the first mask is patterned on location for openings and deposited on a first side (e.g., front side or a non-illuminated side) of the semiconductor substrate. In some embodiments, the first mask is a Silicon Nitride (SiN) based hard etch mask, which is selected for its ability to form critical dimension openings therein. In other embodiments, first mask 204 is formed of a different material capable of having critical dimension openings formed therein, such as silicon oxy-nitride (SiON) and titanium nitride (TiN). As used herein, a "critical" dimension is a feature or pattern formed on a semiconductor substrate and/or mask having any dimension less than or equal to 200 nm, for example 40 nm-200 nm, 40 nm-150 nm, 40 nm-100 nm, 40 nm-90 nm, 40 nm-80 nm, 40 nm-70 nm, 40 nm-60 nm, or 40 nm-50 nm. In some embodiments, the critical dimension is formed using a high precision lithography processing resulting in higher lithography cost compared to a mask patterned with features or patterns having non-critical dimensions.

In step 106, at least a first opening and a second opening are formed in the first mask (such as with lithography patterning and etching process). In this embodiment, the first opening and the second opening correspond to a trench structure (e.g., a shallow trench isolation structure) and to a vertical transfer gate, respectively. In other embodiments, the first opening and the second opening correspond to a vertical transfer gate and to a trench structure (e.g., a trench isolation structure), respectively. In variants of any of the methods described herein, additional openings are formed in the first mask. For example, to form a plurality of isolation structures, a plurality of first openings would be formed in the first mask, and each first opening is processed according to the description herein. Likewise, to form a plurality of vertical transfer gates, a plurality of second openings would be formed in the first mask, and each second opening is processed according to the description herein. Thus, the present disclosure is not limited to methods wherein two openings are formed in the first mask.

The first opening has at least one critical dimension (e.g., a critical width and/or critical length of the trench structure to be formed); likewise, the second opening has at least one corresponding critical dimension (e.g., a critical width and/or a critical length/height of the vertical transfer gate to be formed). For example, in embodiments where the second opening corresponds to a vertical transfer gate having a pillar structure (e.g., square or circular), the second opening may have a critical width and a critical length). In embodiments where the first or second openings corresponds to a shallow trench isolation structure or a deep trench isolation structure, the opening may have a critical width but a non-critical length. In some embodiments, one or both of the first opening or the second opening do not have a critical dimension formed therein.

The first opening has a first dimension (in this embodiment, a first width having a first critical width dimension) and the second opening has a corresponding second dimension (in this embodiment, a second width having a second critical width dimension) in the same dimension. "Width" is used consistently throughout this disclosure to describe a dimension in a trench width plane, i.e., a reference plane which, in some embodiments, corresponds to a channel width plane of a transistor area of a pixel. That is, when two openings have a dimension in the channel width plane, those dimensions are in the same plane. However, the present disclosure is not limited to methods in which trench width is the relevant dimension of the first and second openings.

Restated, in some embodiments, trench length in one or more trench length reference planes or along a trench length dimension parallel to one or more trench length reference planes is the relevant dimension. A trench length reference plane is generally orthogonal to the trench width reference plane in any given example. See FIG. 4 (a trench width plane extends through vertical transfer gate 432, and a trench length plane extends orthogonally through trench isolation structure 410). For example, in some embodiments, the first opening has a length in a trench length reference plane (e.g., a first critical length dimension) and the second opening has a corresponding second length (e.g., a second critical length dimension) in the same trench length dimension. Accordingly, in any of the methods described herein, "width" can be substituted for "length." Also, in any embodiment, the first opening can have a different width and length (e.g., in the case in which the opening corresponds to a trench isolation structure having a small width and relatively long length or a vertical transfer gate having fin-like structure i.e., a critical width and relatively long length). Similarly, in any embodiment, the first opening can have a same width and length (e.g., in the case in which the opening corresponds to a vertical transfer gate having a pillar structure with equal width and length). Moreover, in any embodiment, the first opening may have a different length and/or width from the second opening.

In some embodiments, such as described below with respect to FIG. 2A-FIG. 2I, the first width is equal to the second width. Advantageously, when the first width is equal to the second width, at least two trenches of the same depth may be formed by a common etching step. In other embodiments, such as described below with respect to FIG. 3A-FIG. 3I, the first width differs from the second width. This enables formation of at least two trenches having different depths from a common etching step.

In step 108, the semiconductor substrate is etched through the first opening and the second opening, thereby forming a first trench and a second trench in the semiconductor substrate, respectively. In some embodiments in which the first width equals the second width, the first trench and the second trench have a common depth (e.g., to a first depth in the semiconductor substrate with respect to the first side of semiconductor substrate). In other embodiments in which the first width differs from the second width, the first trench and the second trench have different depths. In some embodiments, step 106 and step 108 may be implemented in a same etching process e.g., a single etching process etches the first trench and the second trench in the semiconductor substrate at substantially a same time as the first and second opening.

In step 110, a trench structure material is deposited in the first trench and in the second trench, thereby forming a first trench structure and a second trench structure. In some embodiments, trench structure material is formed of dielectric material including oxide-based material, e.g., silicon oxide. In some embodiments, trench structure material is formed of high k material, dielectric material with low dielectric constant, or silicon nitride. In some embodiments, trench structure material is formed of organic polymer material. In some embodiments, the first trench structure is an isolation structure such as a shallow trench isolation structure or a deep trench isolation structure. The second trench structure is a temporary trench structure. In some embodiments, the trench structure material is deposited as a sacrificial material to the second trench. In some embodiments, where the first trench corresponds to a vertical transfer gate and the second trench corresponds to front-side deep trench isolation, the trench structure material deposited in the first trench and the second trench is a sacrificial material. In some embodiments, a chemical mechanical polishing process is applied after the deposition of trench structure material the first trench and in the second trench, such as to remove an excess portion of the trench structure material extending above a front side of the semiconductor substrate.

In step 112, a second mask (e.g., a non-critical mask) is provided or formed on the first mask. The second mask covers the first opening on the first mask. A third opening is formed in the second mask (such as with lithography) over the second opening of the first mask. The third opening has a third width, the third width being wider than the second width of the second opening of the first mask. In some embodiment, the third opening on the third mask corresponds to the location of second opening on the second mask and the third width of the third opening is configured based on the second opening on the second mask. The second mask covers the first trench structure and prevents subsequent etching thereof from damaging the first trench structure. Because any subsequent etching process is constrained by the second opening (i.e., a critical opening) of the first mask due to the placement of the third opening of the second mask, the second mask can be a non-critical mask formed of a less expensive material than the first mask, such as a photoresist or similar material and process, thereby reduce overall processing cost.

In step 114, the second trench structure is at least partially etched away through both the second opening of the first mask (the critical mask) and through the third opening of the second mask (the non-critical mask). Again, the second opening (e.g., a critical opening) constrains the etching process. Following this step, at least a portion of the trench structure material is removed from the second trench. In embodiments, the trench structure material is removed from the second trench, for example by a dry etching or wet etching process.

In step 116, the second trench is deepened by further etching the semiconductor substrate after removal of all trench structure material to a second depth with respect to the front side of semiconductor substrate. This enables the second trench to reach a deeper target depth of a vertical transfer gate or a deep trench isolation structure, for example.

In step 118, the first mask and the second mask are removed for subsequent processing, for example by a strip and clean process.

Thus, the foregoing method results in the formation of two trenches in the semiconductor substrate, which may have the same or different depths. Advantageously, the foregoing methods may utilize a single critical mask rather than two or more critical masks. In some embodiments, the first and second trenches are utilized to form a trench isolation structure and a vertical transfer gate, respectively, or vice versa.

Detailed variations of the general method will now be described. Reference numerals used with respect to the following figures do not necessarily correspond to reference numerals used to describe the steps of method 100 above.

FIG. 2A-FIG. 2I illustrate a method 200 of manufacturing a portion of a pixel and/or an image sensor having an isolation structure and a vertical transfer gate disposed within a pixel array of the image sensor. In some embodiments, the isolation structure is disposed between a photodiode region and a transistor region providing isolation between the photodiode region and at least one transistor in the transistor region. More generally, the method 200 also illustrates a method of forming at least two trenches in a semiconductor substrate. Although the illustrated method is described in the context of a CMOS image sensor, the trenches can be utilized to form pixel elements other than vertical transfer gates and isolation structures, for example non-planar transistor gates (e.g., for a source follower, row select, and/or reset transistor of an image sensor).

Figure 2A:
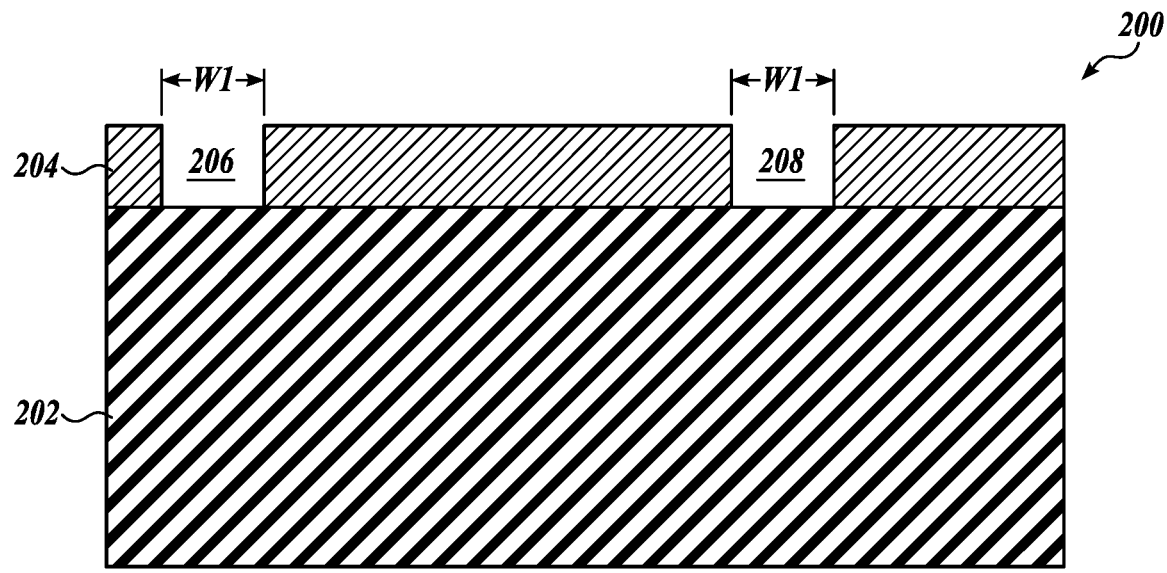
FIG. 2A illustrates forming a first opening and a second opening in a first mask, in accordance with a method of the present disclosure.

As shown in FIG. 2A, a semiconductor substrate 202 is provided, such as a single crystal substrate, semiconductor on insulator (SOI) substrates, doped silicon bulk substrate, an epitaxial film on semiconductor (EPI) substrate, and the like. In some embodiments, the semiconductor substrate 202 may be a pre-processed semiconductor substrate and has one or more layers, doped regions or components formed thereon. For example, the semiconductor substrate 202 may have one or two doped semiconductor material layer epitaxial grown thereon for subsequent photodiode and transistor formation process.

A first mask 204 is provided on the semiconductor substrate 202. The first mask 204 may be provided on a front side 214 (or a non-illuminated side) of the semiconductor substrate 202. In the illustrated embodiment, first mask 204 is a Silicon Nitride (SiN) hard etch mask, which is selected for its ability to form critical dimension openings therein.

At least one first opening 206 and at least one second opening 208 are formed in the first mask 204, e.g., with a lithography process. In the illustrated embodiment, the first opening 206 and second opening 208 are formed at locations corresponding to specific locations of an isolation structure (e.g., a shallow trench isolation structure) and a vertical transfer gate, respectively. In some embodiments, the first opening 206 corresponds to a region between a photodiode region and a transistor region, and the second opening 208 corresponds to a vertical transfer gate between the photodiode region and an associated floating diffusion. In further embodiments, the first opening corresponds to a vertical transfer gate, and the second opening corresponds to an isolation structure (e.g., a front-side deep trench isolation structure configure to surround a photodiode region of a pixel). In some embodiments, additional openings may be formed in the first mask 204, e.g., openings for additional isolation structures (e.g., two) and/or openings for additional vertical transfer gates (e.g., two, three, four, or more).

The first opening 206 has a first width and the second opening 208 has a second width in a trench width plane. In FIG. 2A, first opening 206 and second opening 208 have a common first width W1. Restated, the first width and the second width are both equal to W1. As will be apparent from the method steps described below, this enables a common etching process to form two trenches to a common depth. However, in other embodiments such as described below with respect to FIG. 3A-FIG. 3H, the first opening 206 and second opening 208 have different dimensions, e.g., the first width differs from the second width.

In the illustrated embodiment, the first opening 206 and second opening 208 are openings with critical dimensions in the trench width plane, i.e., openings having at least one dimension less than or equal to 200 nm based on the technology processing node, for example 40 nm-200 nm, 40 nm-150 nm, 40 nm-100 nm, 40 nm-90 nm, 40 nm-80 nm, 40 nm-70 nm, 40 nm-60 nm, or 40 nm-50 nm. In some embodiments, the first opening 206 and/or the second opening 208 also have a critical length in a trench length plane which is orthogonal to the trench width plane. For example, the second opening may have a critical width and a critical length corresponding to a relatively slender vertical transfer gate.

Figure 2B:
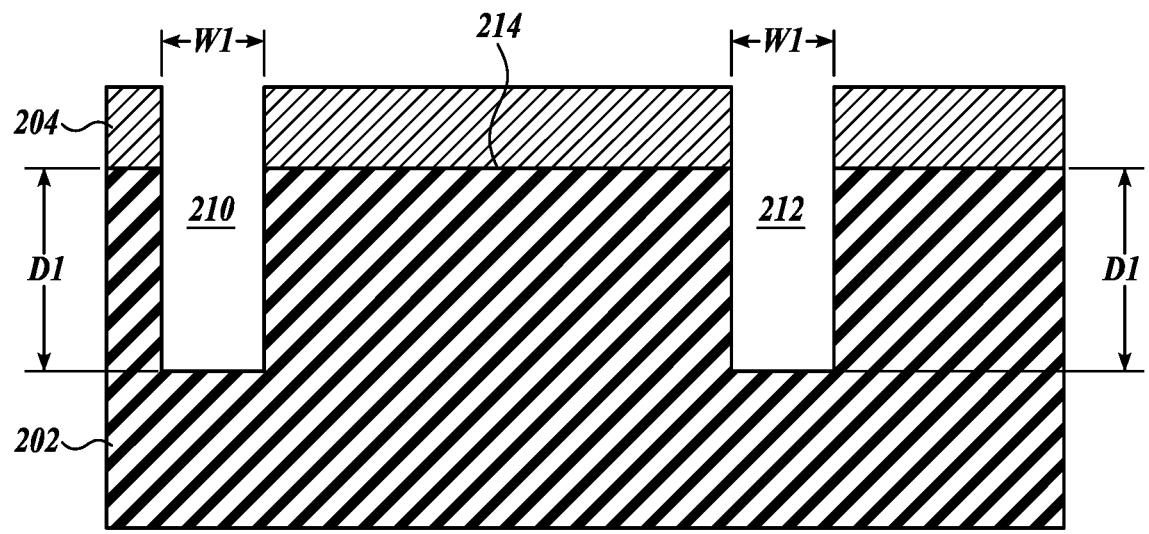
FIG. 2B illustrates forming a first trench and a second trench, in accordance with the teachings of the present disclosure.

Referring now to FIG. 2B, an etching process is performed, thereby etching the semiconductor substrate 202 vertically through the at least one first opening 206 and the at least one second opening 208. The etching process forms at least one first trench 210 and at least one second trench 212 through the first opening 206 and the second opening 208, respectively. In some embodiments, the etching process is a dry anisotropic etching process, such as a plasma dry etching process. Advantageously, this forms two trenches in a single etching step.

As shown in FIG. 2B, the first trench 210 and second trench 212 are formed vertically to a common first depth D1, which in some embodiments is between 150-300 nm with respect to a front side 214 of the semiconductor substrate 202. Note, the front side 214 is provided for reference, and the processes described herein are not limited to front side illuminated image sensors, and are also applicable to back side illuminated image sensors. In some embodiments, the first depth D1 corresponds to a target depth of an isolation structure (e.g., a shallow trench isolation structure).

Figure 2C:
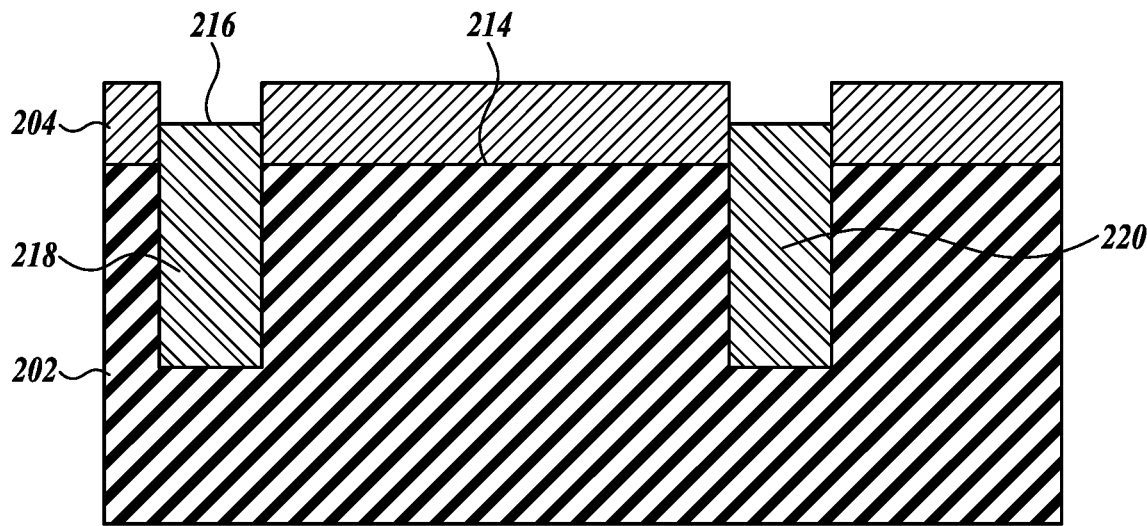
FIG. 2C illustrates forming a first trench structure and a second trench structure, in accordance with the teachings of the present disclosure.

Referring now to FIG. 2C, a trench structure material 216 is deposited into the at least one first trench 210 and in the at least one second trench 212 (e.g., at least up to the front side 214 of the semiconductor substrate 202), thereby forming a first trench structure 218 and a second trench structure 220, respectively. In some embodiments in which the at least one first trench 210 or the second trench 212 corresponds to an isolation structure, the trench structure material is an oxide-based material e.g., silicon oxide. In some embodiments, first trench structure 218 is a shallow trench isolation structure, and the second trench structure 220 is a temporary trench structure. In some embodiments, deposition of the trench structure material 216 is followed by optional further processing such as a chemical mechanical polishing (CMP) process in order to remove an excess portion of the first trench structure 218 and/or second trench structure 220 extending above the front side 214 surface of the semiconductor substrate 202 and above the first mask 204 for subsequent process.

Figure 2D:
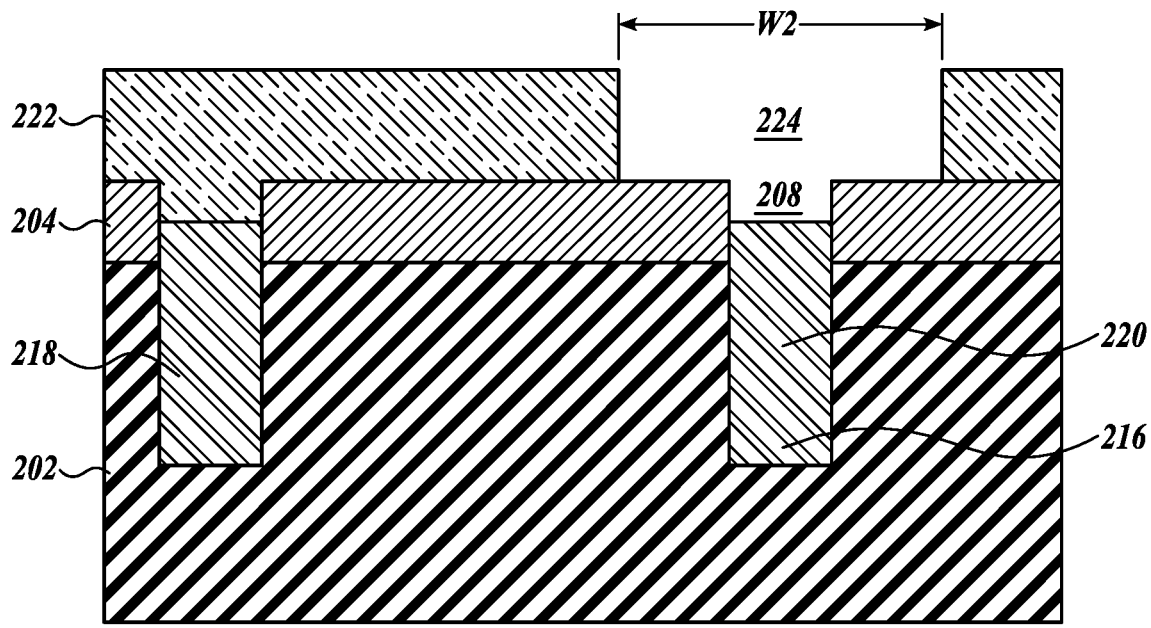
FIG. 2D illustrates forming a third opening in a second mask, in accordance with the teachings of the present disclosure.

Referring now to FIG. 2D, a second mask 222 is deposited on the first mask 204. Using lithography or a similar process, at least one third opening 224 is patterned in the second mask 222 over the second opening 208 of the first mask 204 (i.e., the third opening 224 is superimposed over the second opening 208), while leaving the first opening and the first trench structure 218 covered. As shown, the third opening 224 has a second width W2 which is greater than the first width W1 of the second opening 208. Accordingly, any subsequent etching process will act on the second trench structure 220 through the second mask 222 (but not the first trench structure 218) and will be constrained by the second opening 208 of the first mask 204. For this reason, second mask 222 need not be a critical mask and therefore can be formed from a less-costly material such as a photoresist and less-costly lithography process as the dimension tolerance window is wider. In embodiments wherein the first mask 204 has more than one first opening (e.g., a plurality of first openings corresponding to a plurality of isolation structures), the second mask covers each first opening. In embodiments wherein the first mask 204 has more than one second opening (e.g., a plurality of second openings corresponding to a plurality of vertical transfer gates to be formed), a plurality of third openings 224 would be formed in the second mask, with each third opening 224 corresponding to each second opening in the first mask.

Figure 2E:
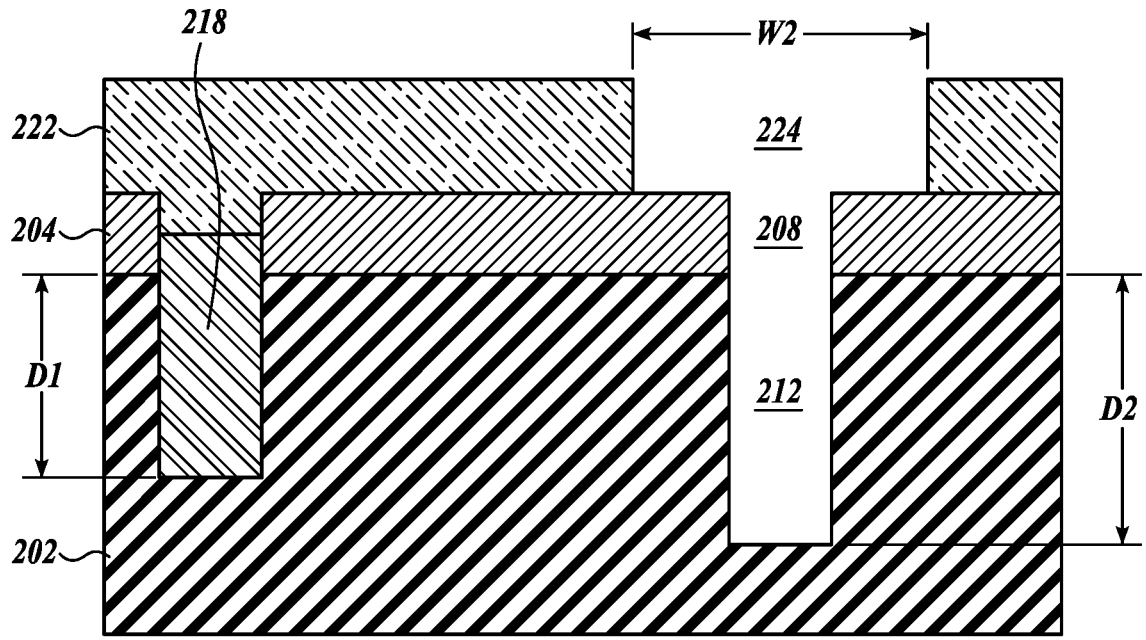
FIG. 2E illustrates etching a second trench structure and deepening the second trench, in accordance with the teachings of the present disclosure.

Referring now to FIG. 2E, at least one subsequent etching process is carried out to etch the at least one second trench structure 220 through the at least one second opening 208 of the first mask 204 and through the at least one third opening 224. In some embodiments, this etching process is a wet etching process (e.g., a SiO₂ wet etching process) or a dry etching process (e.g., a SiCoNi dry etching process) to remove the previously deposited trench structure material 216. In some embodiments, the etching processing to remove the trench structure material 216 is configured with etching parameters e.g., etching agent with high selectivity or high etching rate to trench structure material 216 and semiconductor material over the first mask 204. Accordingly, this etching process removes at least a portion of the trench structure material 216 forming the second trench structure 220. In some embodiments, this etching process removes all trench structure material 216 from the second trench 212, thereby returning the second trench 212 to its state immediately following the first etching process shown in FIG. 2B, i.e., to the first depth D1.

It may be desirable for the at least one second trench 212 to have a different depth (e.g., a deeper depth) than the at least one first trench 210, for example 100-150 nm deeper than the first depth D1 for pixels having photodiodes buried (or formed) at a depth deeper than 250 nm with respect to front side 214 of the semiconductor substrate 202. Or, in some embodiments the second trench 212 may have a depth between 250 nm-4000 nm. Therefore optionally, all trench structure material 216 is removed from the second trench 212, and then the second trench 212 is etched to a second depth D2 which is deeper than the first depth D1. For example, in some embodiments where the at least one second trench 212 corresponds to a deep trench isolation structure, the second trench 212 is deepened to a second depth D2 ranging from 300-1000 nm. In some embodiments, a dry etching process is utilized to deepen the second trench 212. In some embodiments, following this step, the second trench 212 has a target depth corresponding to a vertical transfer gate or a deep trench isolation structure.

Subsequently, the first mask 204 and the second mask 222 are removed by a strip and clean process.

Thus, FIG. 2A-FIG. 2E illustrate a method of forming at least two trenches in a semiconductor substrate, wherein the two trenches may have different depths. Advantageously, the foregoing method produces the two trenches utilizing a single critical mask rather than two critical masks, resulting in lower cost and faster process time. As previously stated, in some embodiments the first trench 210 corresponds to a shallow trench isolation structure and the second trench 212 corresponds to a vertical transfer gate. In other embodiments the first trench 210 corresponds to a vertical transfer gate coupled between a photodiode and floating diffusion and the second trench 212 corresponds to a front-side deep trench isolation structure.

In some embodiments, wherein the at least one first trench 210 corresponds to a vertical transfer gate and the at least one second trench 212 correspond to a front-side deep trench isolation structure, the trench structure material 216 is deposited in the first trench 210 and the second trench 212 as sacrificial material to form first trench structure 218 and second trench structure 220 as temporary trench structures as illustrated in FIG. 2C. The trench structure material 216 deposited in the first trench 210 and the second trench 212 can be an organic polymer material.

After the trench structure material 216 is deposited in the first trench 210 and the second trench 212, an etching process (e.g. wet etching process) is carried out as illustrated in FIG. 2E to the least one second trench structure 220 through the at least one second opening 208 of the first mask 204 and through the at least one third opening 224 to remove the previously deposited trench structure material 216 and deepen the second trench 212 to the second depth, which in embodiments ranges from 1000 to 4000 nm depending on the thickness of the semiconductor substrate 202. Thereafter, oxide-based dielectric material e.g., silicon oxide is deposited into the second trench 212 to form second trench structure 220 e.g., front-side deep trench isolation structure. After, removing the first mask 204 and second mask 222, another etching process is carried out (e.g., wet etching) with etchant (such as O₂ gas) having high etching selectivity between silicon oxide and organic polymer material to remove the organic polymer material formed by the first trench structure 218 from the first trench while leaving the oxide-based dielectric material formed by the second trench structure 220 in the second trench 212.

FIG. 2F-FIG. 2I show optional, additional steps which can be carried out to form one or more vertical transfer gates, e.g., of a pixel and an image sensor.

Figure 2F:
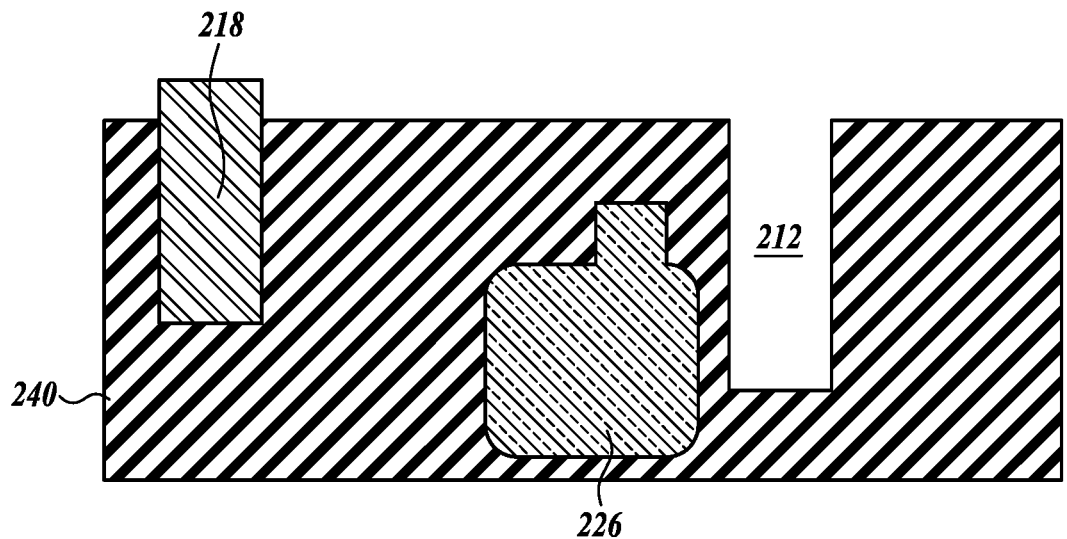
FIG. 2F illustrates forming a photodiode region, in accordance with the teachings of the present disclosure.

Referring to FIG. 2F, after removal of the first mask 204 and second mask 222, at least one photodiode region 226 for a photodiode is formed in the semiconductor substrate 202 adjacent the second trench 212. In some embodiments, an implantation mask for the at least one photodiode region 226 is configured or designed based on the location of the second trench 212. In some embodiments, an optional pinning layer having a conductive type opposite to the photodiode region 226 is implanted proximate to front side 214 of the semiconductor material and together with the photodiode region 226 form a pinned photodiode. In some embodiments, the photodiode region 226 is a region doped with n-type impurities (e.g., arsenic or phosphorus)

Figure 2G:
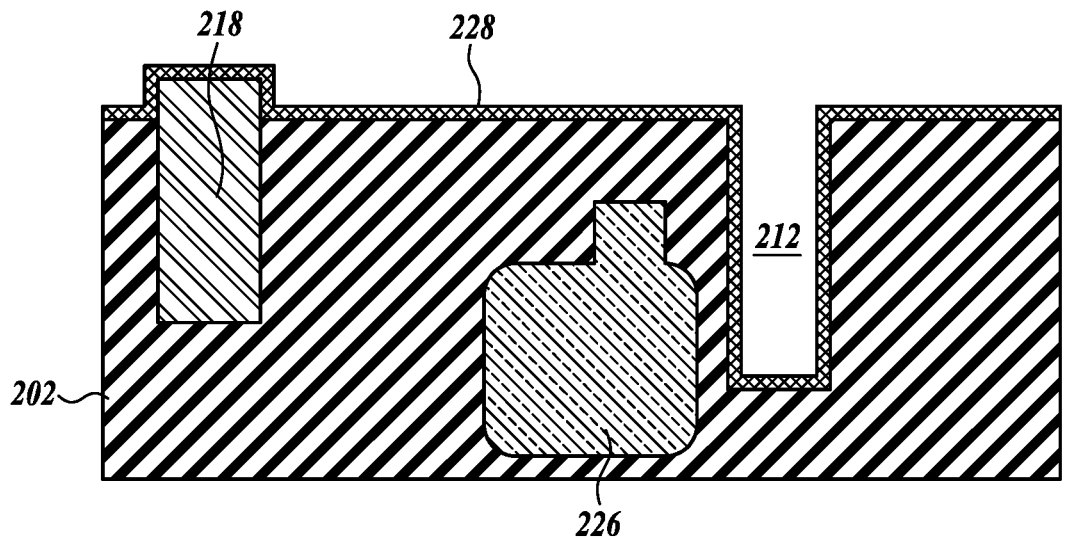
FIG. 2G illustrates forming an isolation layer, in accordance with the teachings of the present disclosure.

Referring to FIG. 2G, an isolation layer 228 is formed on the front side 214 of the semiconductor substrate 202, including in the at least one second trench 212. The isolation layer 228 may be conformally formed on the front side 214 of the semiconductor substrate 202, on the first trench structure 218, and into the at least one second trench 212. Isolation layer 228 functions as a gate isolation layer, and comprises a dielectric, such as an oxide or high-k material, e.g., a material having a dielectric constant that is greater than about 3.9 (e.g., Al₂O₃ or HfO₂). In some embodiments, the isolation layer 228 can be formed by deposition process like chemical vapor deposition or atomic layer deposition. In some embodiments, the isolation layer 228 can be formed on the front side 214 of the semiconductor substrate 202 by thermal oxidation.

Figure 2H:
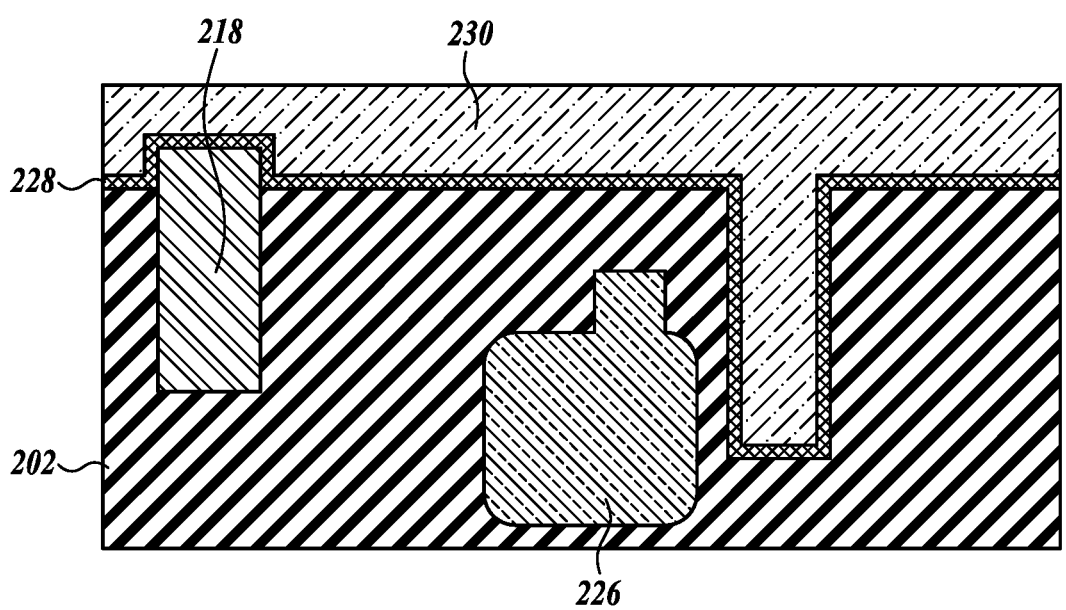
FIG. 2H illustrates depositing a gate material, in accordance with the teachings of the present disclosure.

Referring to FIG. 2H, a gate material 230 is deposited on the isolation layer 228, including in the at least one second trench 212. In the illustrated embodiment, gate material 230 is a conductive material such as polysilicon. In other embodiments, gate material 230 may be another suitable material, for example metals including titanium carbide (TiC), titanium nitride (TiN), or other metal.

Figure 2I:
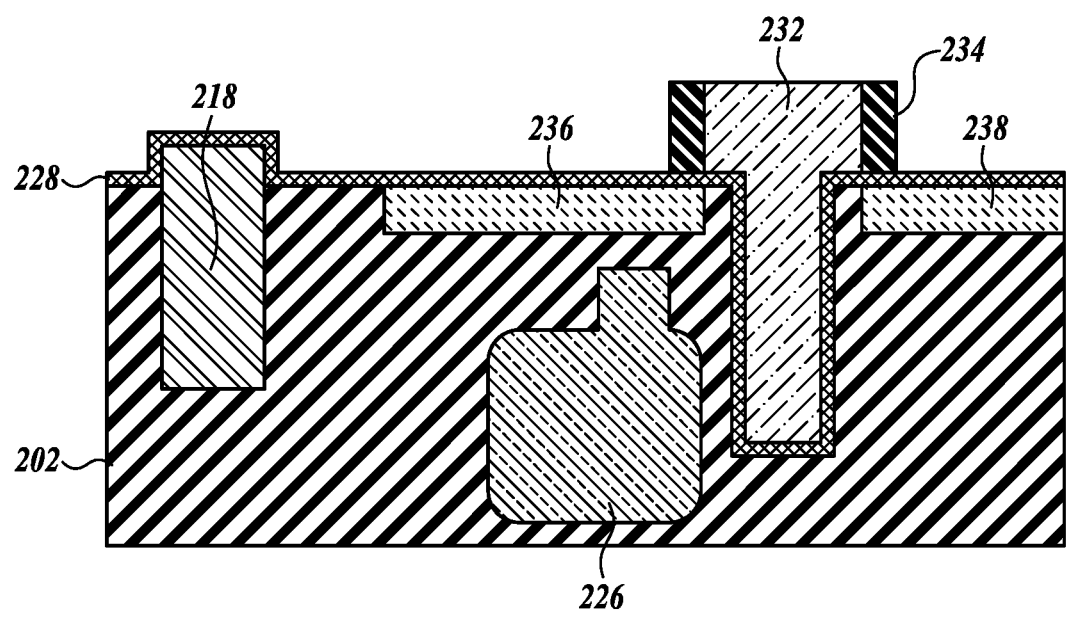
FIG. 2I illustrates forming a vertical transfer gate electrode, in accordance with the teachings of the present disclosure.

After deposition of the gate material 230, further processing may be carried out to form the final vertical transfer gate and/or additional pixel elements. As shown in FIG. 2I, a subsequent etching step is carried out with a third mask in order to remove a portion of the gate material 230, thereby forming at least one vertical transfer gate 232. Optionally, a spacer 234 is formed around the vertical transfer gate 232, e.g., in a configuration that improves current and voltage parameters vertical transfer gate. In some embodiments, the spacer 234 surrounds the vertical transfer gate 232. In some embodiments, spacer 234 is formed of a dielectric material similar to the isolation layer 228, e.g., a single layer or multi-layer stack structure formed of oxide, nitride or a combination thereof.

In some embodiments, where the first trench 210 corresponds to vertical transfer gates and the second trench 212 corresponds to front-side deep trench isolation structures, after the etching process to remove trench structure material of the first trench structure 218 from at least one first trench 210 while leaving second trench structure 220 in the second trench 212, the isolation layer 228 is then formed in the at least one first trench 210 followed by deposition of gate material 230 to form vertical transfer gate 232, as described above.

Optionally, a pinning layer 236 is implanted, for example with an alignment to the spacer 234 as a doped p-type region (e.g., doped with p-type dopants such as boron) having a thickness of 10 nm-about 50 nm-150 nm, e.g., 75 nm-125 nm, 90 nm-110 nm, or 100 nm is formed in the semiconductor substrate 202 over the photodiode region 226.

Optionally, such as in pixels having one or more photodiode regions, a floating diffusion 238 is formed in the semiconductor substrate 202 adjacent to the vertical transfer gate 232 as a doped n-type portion of the semiconductor substrate 202.

Thus, FIG. 2A-FIG. 2I provide a method of forming a vertical transfer gate and an isolation structure (e.g., a shallow trench isolation structure) in a semiconductor substrate utilizing a single critical mask rather than two, resulting in lower cost and faster process time.

FIG. 3A-FIG. 3I illustrate an alternative method 300 of manufacturing an image sensor having an isolation structure and a vertical transfer gate. More generally, the method 300 also illustrates a method of forming at least two trenches in a semiconductor substrate. Terms used below have alike meanings as alike terms used above, except where expressed or implied otherwise. Similarly, process steps described below may be performed in the same way(s) as process steps described above, except where expressed or implied otherwise. Further, the methods described below may be modified as described above, e.g., to form a plurality of vertical transfer gates and/or a plurality of isolation structures, or wherein a length (additionally or alternatively to a width) is the relevant dimension of openings formed in the first mask.

Figure 3A:
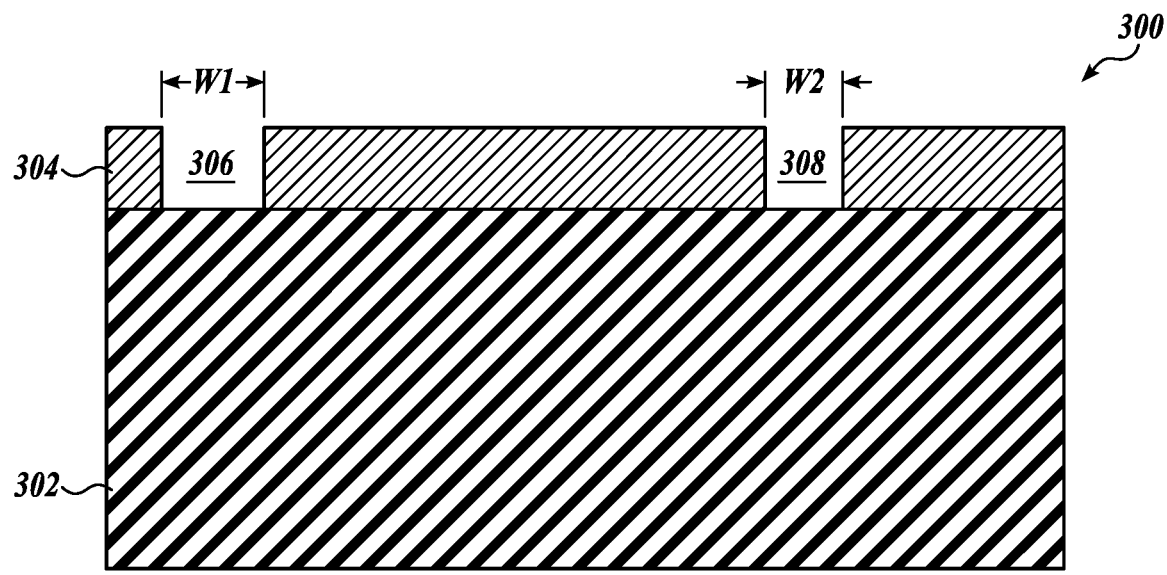
FIG. 3A illustrates formation of a first opening and a second opening in a first mask, in accordance with an alternative method of the present disclosure.

As shown in FIG. 3A, a semiconductor substrate 302 is provided, and a first mask 304 is provided thereon. In the illustrated embodiment, first mask 304 is a Silicon Nitride (SiN) hard etch mask. In some embodiments, the semiconductor substrate 302 may be a pre-processed semiconductor substrate and has one or more layers, doped regions or components formed thereon. For example, the semiconductor substrate 302 may have one or two doped semiconductor material layer epitaxial grown thereon for subsequent photodiode and transistor formation process.

At least one first opening 306 and at least one second opening 308 are formed in the first mask 304 (e.g., with lithography) at locations corresponding to desired locations of at least one isolation structure and at least one vertical transfer gate, respectively. The first opening 306 has a first width W1 (e.g., a first critical width less than or equal to 200 nm, for example 40 nm-200 nm, 40 nm-100 nm, 40 nm-90 nm, 40 nm-80 nm, 40 nm-70 nm, 40 nm-60 nm, or 40 nm-50 nm) and the second opening 308 has a second width W2 (e.g., a second critical width less than or equal to 200 nm, for example 40 nm-200 nm, 40 nm-100 nm, 40 nm-90 nm, 40 nm-80 nm, 40 nm-70 nm, 40 nm-60 nm, or 40 nm-50 nm).

Unlike the method 200 described above with respect to FIG. 2A-FIG. 2I, in the method 300, first opening 306 and second opening 308 have different widths. Restated, the first width W1 differs from the second width W2. As will be apparent from the method steps described below, this enables a common etching process to form two trenches to different depths. In the illustrated embodiment, W2 is less than W1. Advantageously, this enables formation of a deeper trench through the second opening 308 than through the first opening 306, e.g., for a deeper vertical transfer gate.

Figure 3B:
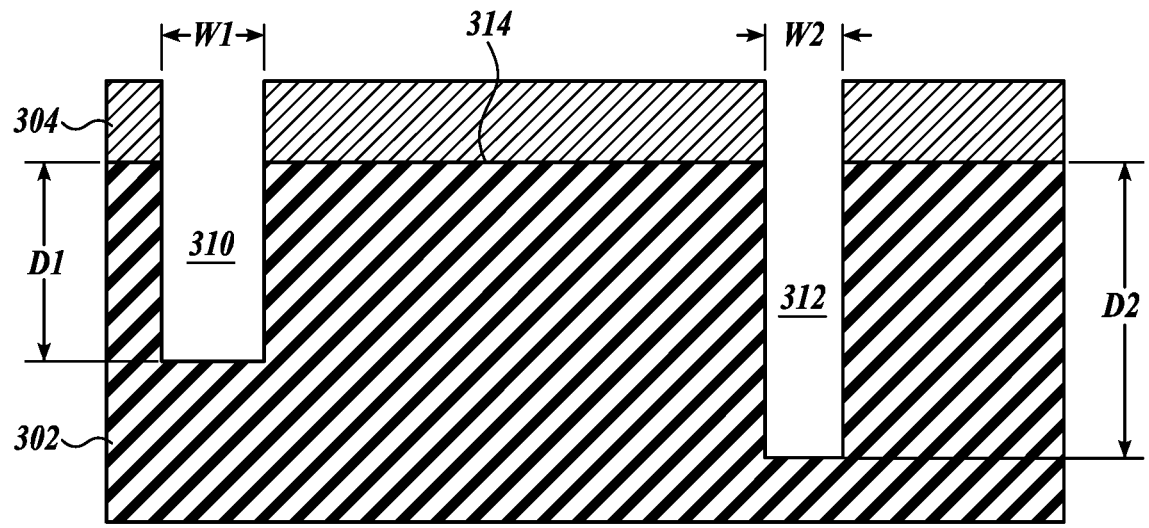
FIG. 3B illustrates forming a first trench and a second trench, in accordance with the teachings of the present disclosure.

Referring now to FIG. 3B, an etching process is performed, thereby etching the semiconductor substrate 302 through the first opening 306 and through the second opening 308. The etching process forms a first trench 310 and a second trench 312 through the first opening 306 and the second opening 308, respectively. In some embodiments, the etching process is a dry etching process. For example, the etching process is plasma dry etching with etching parameters e.g., temperature, etching gas pressure, etching duration, controlled to induce loading effect to form first and second trenches 310, 312 with different depth. Advantageously, this results in the formation of two trenches with different depths from a single etching step.

As shown in FIG. 3B, as a result of the etching process, the first trench 310 is formed to a first depth D1, which in some embodiments is between 150-300 nm with respect to a front side 314 of the semiconductor substrate 302. In some embodiments, the first depth D1 corresponds to a target depth of an isolation structure (e.g., a shallow trench isolation structure). As a result of the etching process, the second trench 312 is formed to a second depth D2, which in some embodiments is between 250 nm-1000 nm with respect to the front side 314. In some embodiments, the second depth D2 corresponds to a target depth of a vertical transfer gate. In some embodiments, a single etching process etches the first trench 310 and the second trench 312 in the semiconductor substrate 302 at substantially a same time as the first opening 306 and the second opening 308.

Figure 3C:
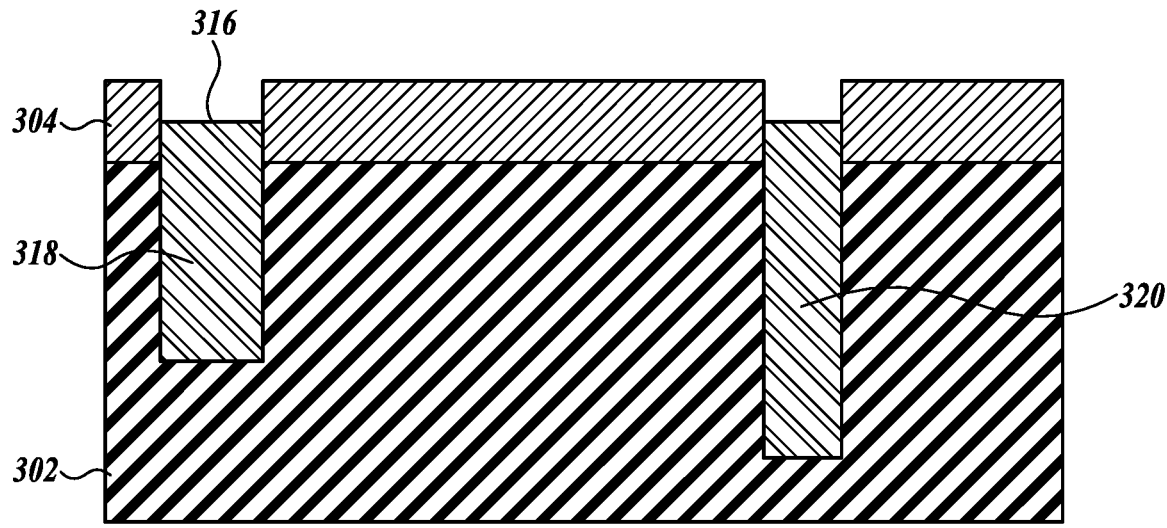
FIG. 3C illustrates forming a first trench structure and a second trench structure, in accordance with the teachings of the present disclosure.

Referring now to FIG. 3C, a trench structure material 316 such as an oxide-based material e.g., silicon oxide is deposited into the first trench 310 and in the second trench 312, thereby forming a first trench structure 318 and a second trench structure 320, respectively. In this embodiment, first trench structure 318 is a shallow trench isolation structure, and the second trench structure 320 is a temporary trench structure. In some embodiments, deposition of the trench structure material 316 is followed by further processing such as a chemical mechanical polishing (CMP) process in order to remove an excess portion of the first trench structure 318 and/or second trench structure 320 extending above the front side 314 of the semiconductor substrate 302 and/or the first mask 304.

Figure 3D:
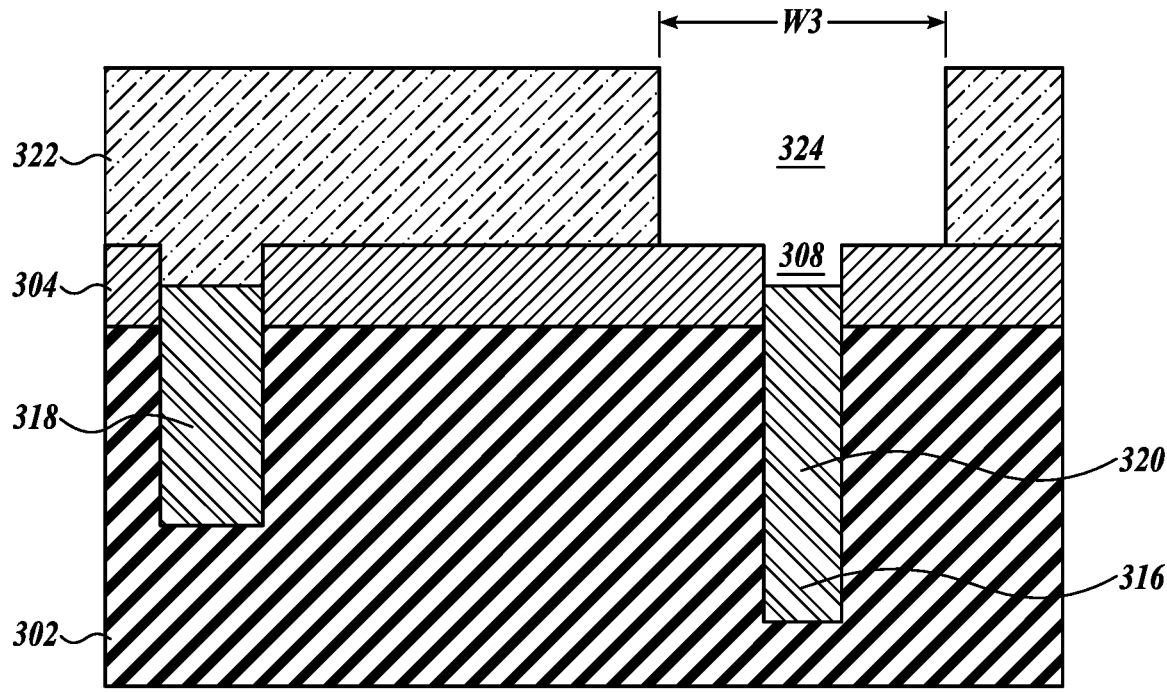
FIG. 3D illustrates forming a third opening in a second mask, in accordance with the teachings of the present disclosure.

Referring now to FIG. 3D, a second mask 322 is a photoresist layer deposited on the first mask 304. Using lithography or a similar process, a third opening 324 is patterned in the second mask 322 over the second opening 308 of the first mask 304, while leaving the first opening 306 and the first trench structure 318 covered (i.e., the third opening 324 is superimposed over the second opening 308). In embodiment, the thickness of the second mask 322 is greater than the thickness of the first mask 304. As shown, the third opening 324 has a third width W3 which is greater than the second width W2 of the second opening 308. Accordingly, any subsequent etching process will act on the second trench structure 320 through the second mask 322

(but not the first trench structure 318) and will be constrained by the second opening 308 of the first mask 304. For this reason, second mask 322 need not be a critical mask and can be formed from a less-costly material such as a photoresist.

Figure 3E:
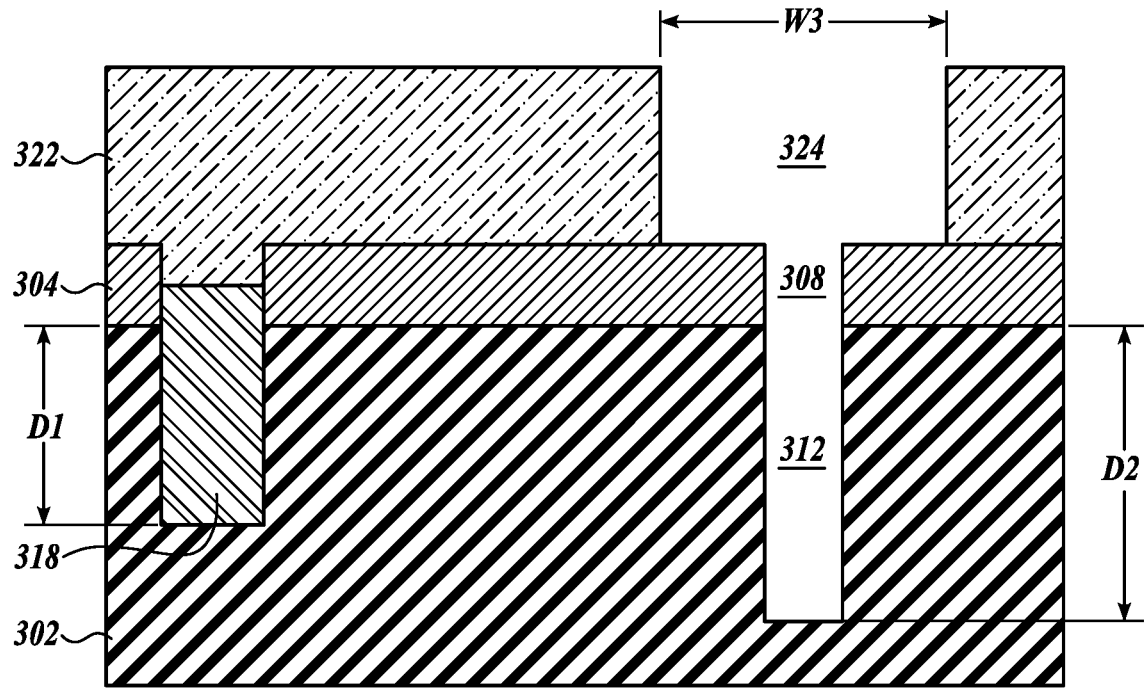
FIG. 3E illustrates etching a second trench structure, in accordance with the teachings of the present disclosure.

Referring now to FIG. 3D in connection with FIG. 3E, at least one subsequent etching process is carried out to etch the second trench structure 320 through the second opening 308 of the first mask 304 and through the third opening 324 of the second mask 322. This etching process removes at least a portion of the trench structure material 316 from the second trench 312. In some embodiments, this etching process removes all trench structure material 316 from the second trench 312, thereby returning the second trench 312 to its state immediately following the first etching process shown in FIG. 3B, i.e., to the second depth D2.

Subsequently, the first mask 304 and the second mask 322 are removed, for example by a strip and clean process. Thus, FIG. 3A-FIG. 3E illustrate a method of forming at least two trenches in a semiconductor substrate, wherein the two trenches have different depths. Advantageously, the foregoing method produces the two trenches having different depth utilizing a single critical mask rather than two, resulting in lower cost and faster process time. In some embodiments, the first trench 310 corresponds to a shallow trench isolation structure and the second trench 312 corresponds to a vertical transfer gate. In other embodiments, the first trench 310 corresponds to a vertical transfer gate and the second trench 312 corresponds to a front-side deep trench isolation structure.

FIG. 3F-FIG. 3I show optional, additional steps which can be carried out to form a vertical transfer gate.

Figure 3F:
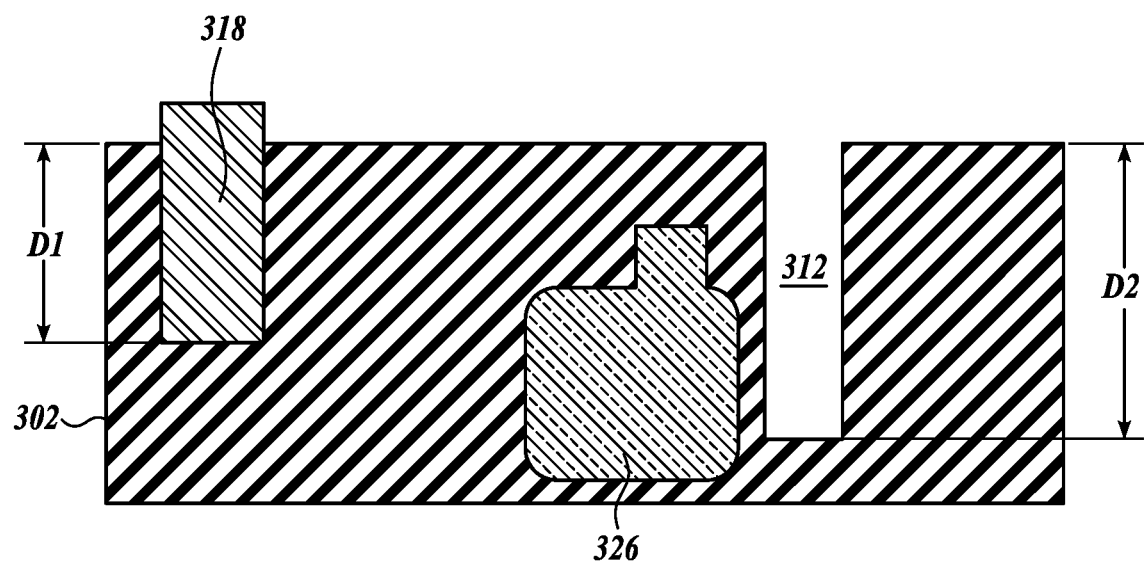
FIG. 3F illustrates forming a photodiode region, in accordance with the teachings of the present disclosure.

Referring to FIG. 3F, after removal of the first mask 304 and second mask 322, at least one photodiode region 326 is formed in the semiconductor substrate 302 adjacent the second trench 312.

Figure 3G:
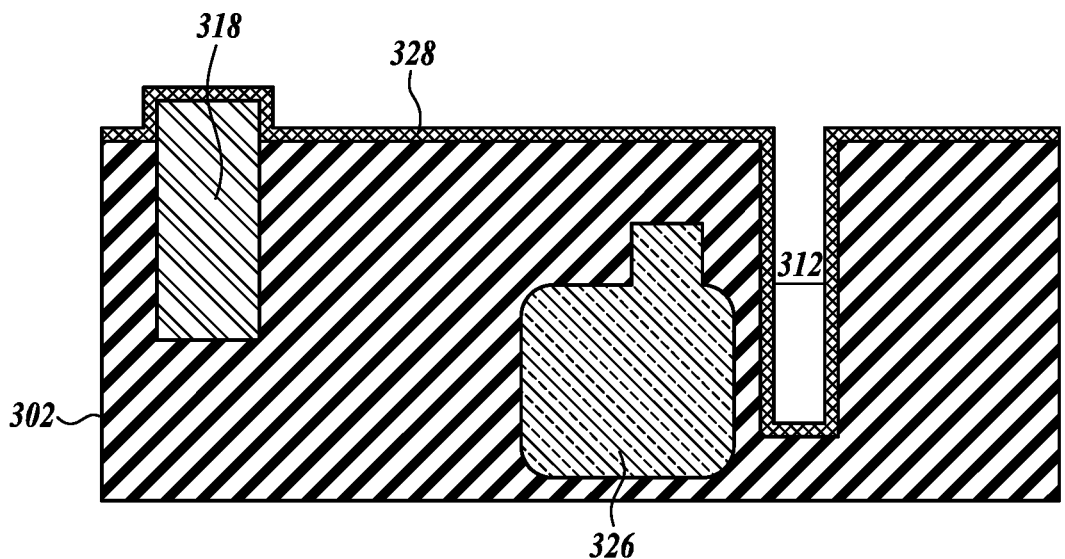
FIG. 3G illustrates forming an isolation layer, in accordance with the teachings of the present disclosure.

Referring to FIG. 3G, an isolation layer 328 is formed on the front side 314 of the semiconductor substrate 302, including in the second trench 312. In some embodiments, the isolation layer 328 can be formed by a deposition process such as a chemical vapor deposition or atomic layer deposition. The isolation layer 328 can be formed on the front side 314 of the semiconductor substrate 302 by thermal oxidation. In some embodiments, the isolation layer 328 lines the second trench 312 conformally. Isolation layer 328 functions as a gate isolation layer for the vertical transfer gate.

Figure 3H:
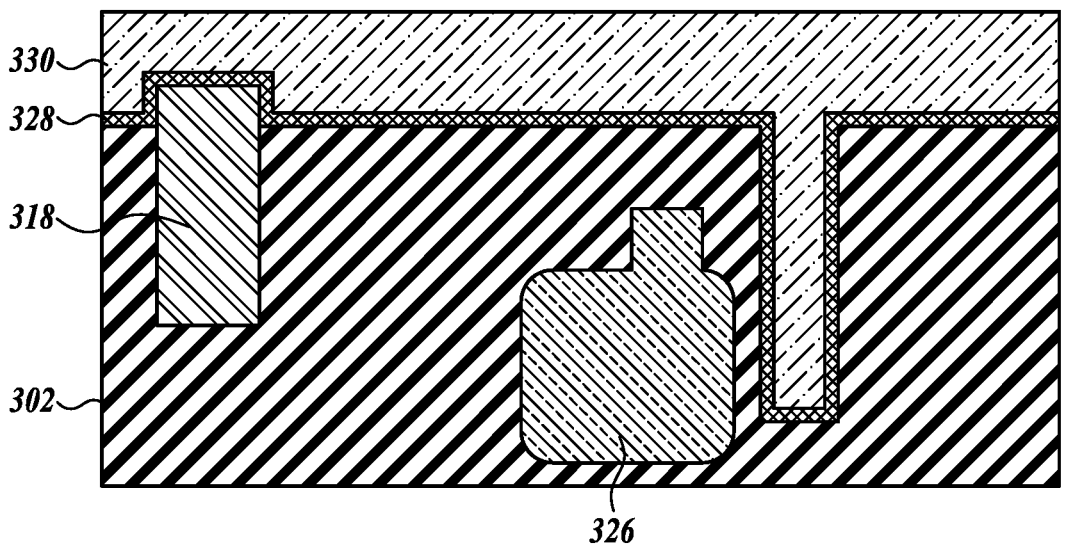
FIG. 3H illustrates depositing a gate material, in accordance with the teachings of the present disclosure.

Referring to FIG. 3H, a gate material 330 is deposited on the isolation layer 328, including in the second trench 312.

In some embodiments where the first trench 310 corresponds to a vertical transfer gate and the second trench 312 corresponds to a deep trench isolation structure, the isolation layer 328 and gate material 330 are deposited into the first trench 310 respectively after removal of the first mask 304 and second mask 322, in order to form vertical transfer gate 332 in the first trench 310.

Figure 3I:
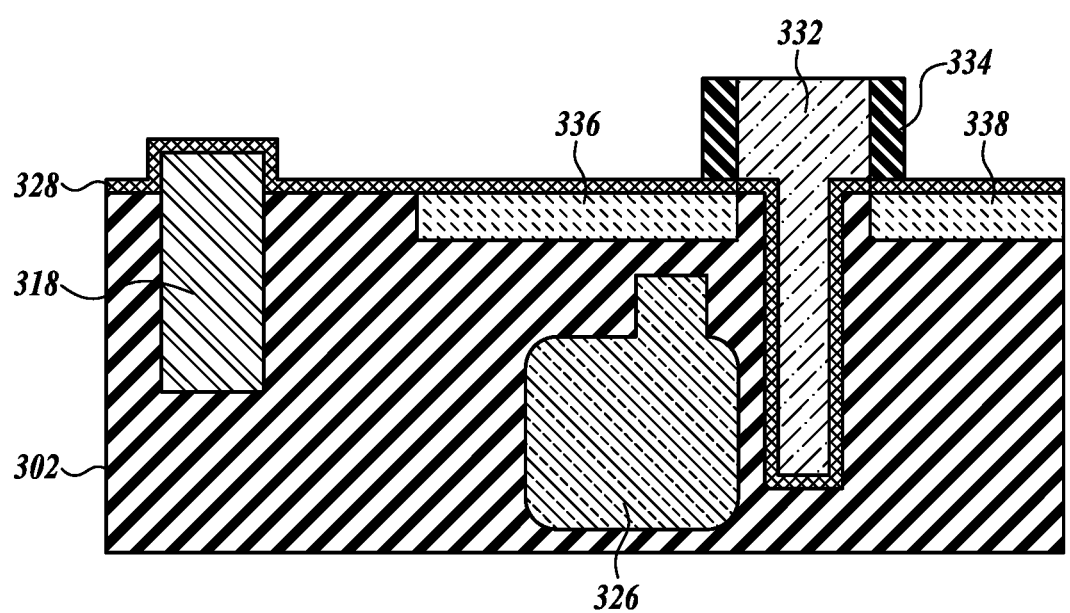
FIG. 3I illustrates forming a vertical transfer gate electrode, in accordance with the teachings of the present disclosure.

After deposition of the gate material 330, further processing may be carried out to form the final vertical transfer gate and/or additional pixel elements. As shown in FIG. 3I, a subsequent etching step is carried out with a third mask in order to remove a portion of the gate material 330, thereby forming the vertical transfer gate 332. Optionally, a spacer 334 is formed around the vertical transfer gate 332, e.g., in a configuration that improves current and voltage parameters vertical transfer gate. In some embodiments, the spacer 334 surrounds the vertical transfer gate 332.

Optionally, a pinning layer 336 implanted, for example with an alignment to the spacer 334 as a doped p-type portion is formed in the semiconductor substrate 302 over the photodiode region 326.

Optionally, a floating diffusion 338 is formed adjacent to the vertical transfer gate 332 as a doped n-type portion of the semiconductor substrate 302, for example by implantation process.

Figure 4:
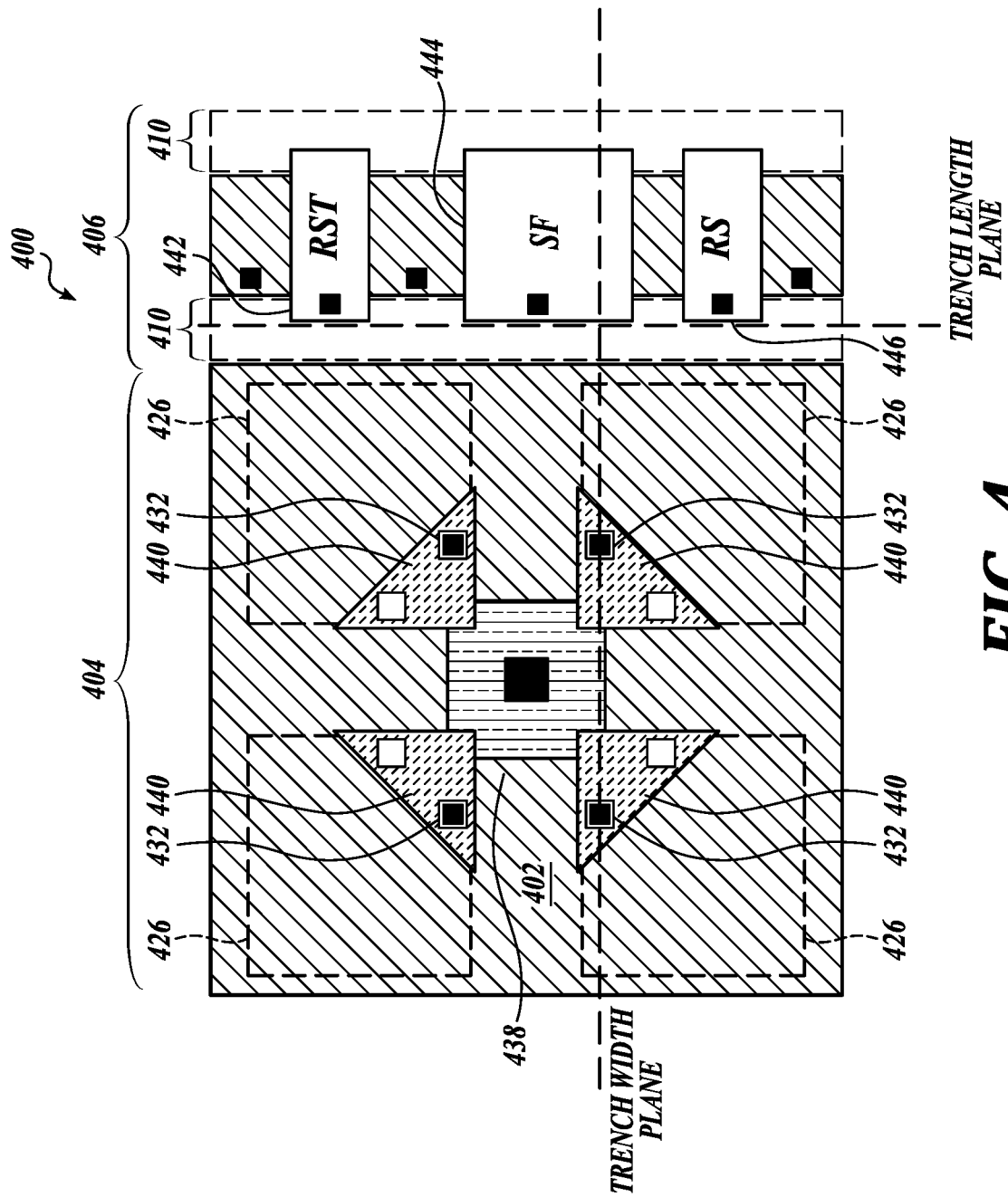
FIG. 4 shows an embodiment of a layout of a pixel partially formed in accordance with the teachings of the present disclosure.

Thus, FIG. 3A-FIG. 3I provide a method of forming a vertical transfer gate and an isolation structure (e.g., a shallow trench isolation structure) in a semiconductor substrate utilizing a single critical mask rather than two, resulting in lower cost and faster process time. FIG. 4 shows one representative layout of a simplified "four-shared" pixel 400, which may be formed according to the methods of the present disclosure. That is, the methods provided herein may be utilized to form trenches, isolation structures, and vertical transfer gates forming part of pixel 400. Pixel 400 may be utilized in an image sensor such as the image sensor 500 of FIG. 5, which itself may be integrated into an electronic device such as a smart phone. The pixel layout shown in FIG. 4 is representative, and the teachings of the present disclosure may be embodied in many other pixel layouts.

Pixel 400 is at least partially formed from a semiconductor substrate 402 having an active pixel area 404 that includes at least one photodiode region 426 (in this embodiment, four photodiode regions 426), a floating diffusion 438, a transfer transistor 440 having at least a vertical transfer gate 432 for each photodiode region 426, and a device transistor area 406 that includes a reset transistor 442, a source follower transistor 444, and a row select transistor 446.

Each photodiode region 426 is configured to photogenerate and accumulate charge carriers (e.g., electrons, holes) in response to incoming light received during an integration period of the image sensor. The photogenerated charge carriers accumulated in a charge accumulation region of photodiode region 426 (i.e., a source of corresponding transfer transistor 440), for example during the integration period of an image sensor, can be selectively transferred to the floating diffusion 438 (e.g., drain of transfer transistor 440) depending on voltage applied to the vertical transfer gate 432 of transfer transistor 440. In some embodiments, one or more of the photodiode regions 426 has a pinned photodiode configuration, i.e., has a pinning layer formed above the photodiode region 426.

Floating diffusion 438 is coupled to the vertical transfer gate 432 of each transfer transistor 440. Floating diffusion 438 is further coupled a gate of source follower transistor 444. The floating diffusion 438 aggregates charge carriers from photodiode regions 426 (via one or more transfer transistors 440) and outputs a corresponding voltage to the gate of source follower transistor 444 for signal read out.

The vertical transfer gates 432 are each analogous to the vertical transfer gates 232, 332 described above. Accordingly, the vertical transfer gates 432 may be formed according to the methods described herein. The vertical transfer gate 432 of each transfer transistor 440 forms a conduction channel that transfers charge from the corresponding photodiode regions 426 to floating diffusion 438, which in turn applies a voltage to the gate of source follower transistor 444 based on the amount of charge accumulated in the floating diffusion 438. The source follower transistor 444 outputs an amplified image signal in response to the voltage received at the gate thereof.

Reset transistor 442 resets (e.g., discharges or charges) coupled photodiode regions 426 via transfer transistors 440 and coupled floating diffusion 438 to a preset voltage, e.g., a supply voltage $V_{DD}$, under control of a reset signal received at the gate of reset transistor 442 during a reset period.

Source follower transistor 444 is coupled between a supply voltage $V_{DD}$ and row select transistor 446, and modulates the image signal output based on the voltage received from the floating diffusion 438 at the gate thereof, where the image signal corresponds to the amount photo-electrons accumulated in charge accumulation region of coupled photodiode region 426 in response to the amount of incident light absorbed during the integration period at the gate thereof.

Row select transistor 446 selectively couples the output of the source follower transistor 444 (e.g., image signal) to the readout column line under control of a row select signal during read out operation of the image sensor.

The device transistor area is isolated from the active pixel area having transfer transistors 440, photodiode regions 426, and floating diffusion 438 by trench isolation structures 410 (e.g., shallow trench isolation structures or front-side deep trench isolation structures). The trench isolation structures 410 are analogous to the first trench structures 218 and 318 described above. Accordingly, the trench isolation structures 410 may be formed in accordance with the methods described herein.

In some embodiments, pixel 400 may include additional elements that are not described in detail herein, such as one or more additional transistors, capacitors, floating diffusions, or the like. In the illustrated example, pixel 400 includes a four photodiode regions 426; however, some embodiments include a lesser or greater number of photodiode regions.

In operation, during the integration period of the image sensor (also referred to as an exposure or accumulation period), photodiode regions 426 absorb incident light on the corresponding charge accumulation regions. The photogenerated charges accumulated in the charge accumulation regions of the photodiode regions 426 indicates the amount of incident light incident onto the charge accumulation regions. After the integration period, a transfer signal (e.g., a positive biasing voltage) applies, for example from a control circuitry 510 of FIG. 5, to the vertical transfer gates 432, which turns on the transfer transistors 440 to transfer the photogenerated charge from coupled photodiode regions 426 to the floating diffusion 438 during the charge transfer period of the image sensor. The source follower transistor 444 operatively generates the image signal based on voltage outputted by the coupled floating diffusion 438. The row select transistor 446 coupled to source follower transistor 444 then selectively couples the image signal onto a column bit line upon receiving a row select signal from the control circuitry 510 of FIG. 5 during a readout period for subsequent image processing.

For reference, a representative trench width plane extends through vertical transfer gate 432, and a representative trench length plane extends orthogonally through trench isolation structure 410.

Figure 5:
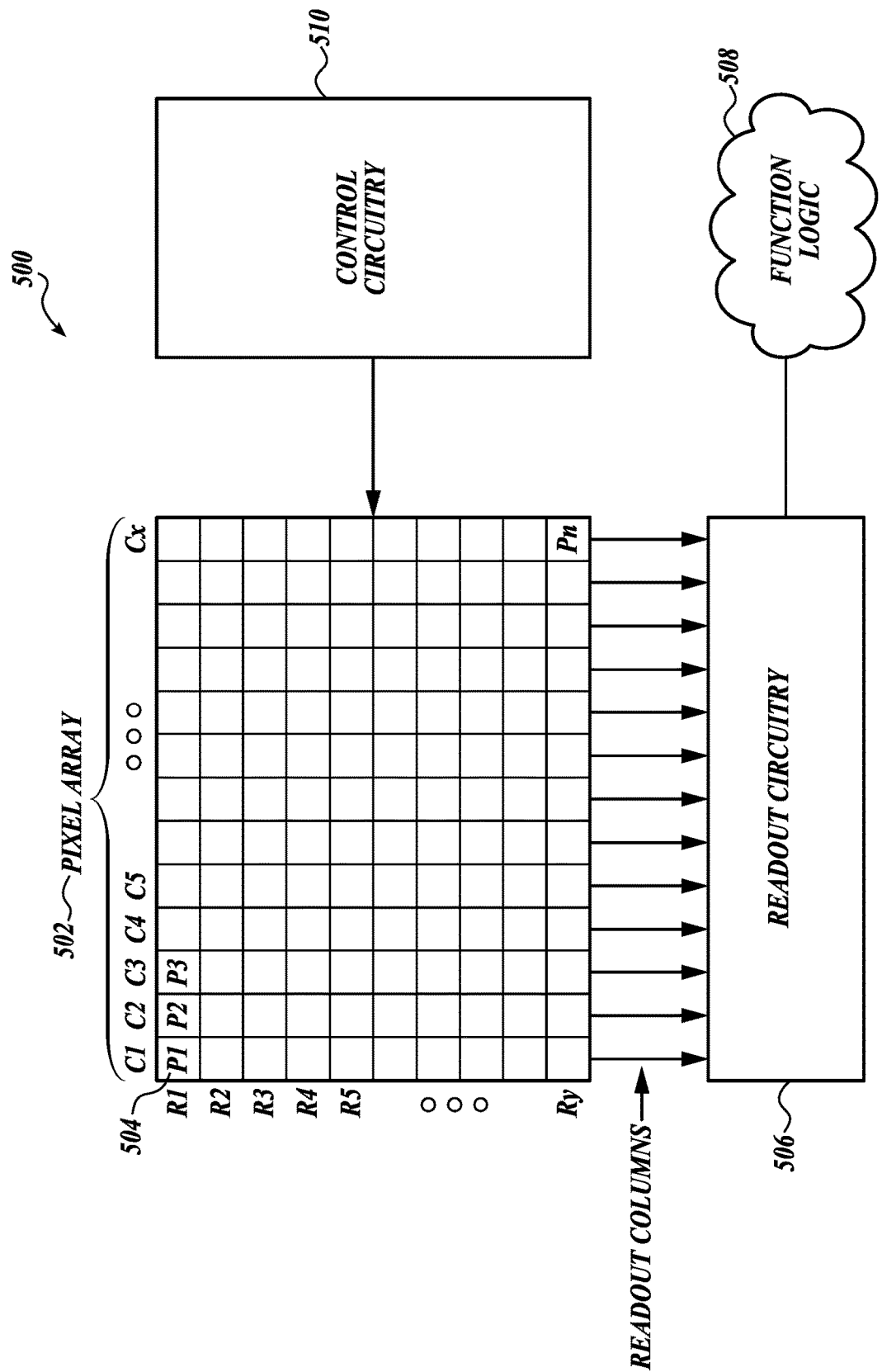
FIG. 5 is a block diagram illustrating an embodiment of an image sensor in accordance with the teachings of the present disclosure.

FIG. 5 is a diagram illustrating one example of a representative image sensor 500, which may be formed according to the methods of the present disclosure. Reference numerals used to describe the image sensor 500 do not necessarily correspond with reference numerals previously introduced with respect to FIG. 1-FIG. 4. Image sensor 500 includes a pixel array 502 of pixels 504. As shown, the pixel array 502 is coupled to a readout circuitry 506 (which is coupled to a function logic 508) and to a control circuitry 510.

Pixel array 502 is a two-dimensional ("2D") array of pixels 504 (e.g., pixels P1, P2 ..., Pn). In one embodiment, each pixel 504 is a complementary metal-oxide-semiconductor ("CMOS") imaging pixel. Pixel array 502 may be implemented as either a front side illuminated image sensor array, or a backside illuminated image sensor array. In some embodiments, pixels 504 include one or more transistors, including transfer transistor with vertical transfer gate source follower transistors, row select transistors, and reset transistors. As illustrated, the pixels 504 are arranged into rows (e.g., rows R1 to Ry) and columns (e.g., column C1 to Cx) to acquire image data of a person, place, or object, which can then be used to render a 2D image of the person, place, or object.

After a pixel 504 has acquired its image data or image charge, the image data is readout by readout circuitry 506 and transferred to function logic 508. Readout circuitry 506 may include amplification circuitry, e.g., a differential amplifier circuitry, analog-to-digital ("ADC") conversion circuitry, or otherwise. In some embodiments, the readout circuitry 506 may readout a row of image data at a time along readout column lines (illustrated) or may readout the image data using a variety of other techniques (not illustrated), such as a serial readout or a full parallel readout of all pixels simultaneously.

Function logic 508 includes logic and memory for storing the image data or even manipulating the image data by applying post image effects (e.g., crop, rotate, remove red eye, adjust brightness, adjust contrast, or otherwise).

Control circuitry 510 is coupled to pixels 504, and includes logic and memory for controlling operational characteristics of pixels 504. For example, control circuitry 510 may generate a shutter signal for controlling image acquisition. In some embodiments, the shutter signal is a global shutter signal for simultaneously enabling all pixels 504 to simultaneously capture their respective image data during a single acquisition window. In some embodiments, the shutter signal is a rolling shutter signal whereby each row, column, or group of pixels 504 is sequentially enabled during consecutive acquisition windows.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

Modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

The present application may also reference quantities and numbers. Unless specifically stated, such quantities and numbers are not to be considered restrictive, but representative of the possible quantities or numbers associated with the present application. Ranges of quantities described and claimed herein shall be interpreted as inclusive of the low and high values stated. Also in this regard, the present application may use the term "plurality" to reference a quantity or number. In this regard, the term "plurality" is meant to be any number that is more than one, for example, two, three, four, five, etc. The terms "about," "approximately," "substantially," etc., means plus or minus 5% of the stated value. The term "based upon" means "based at least partially upon."

What is claimed is:

1. A method of forming trench structures in a semiconductor substrate, comprising:
providing a semiconductor substrate;
providing a first mask on the semiconductor substrate;
forming at least a first opening and a second opening in the first mask, wherein the first opening has a first dimension and the second opening has a corresponding second dimension;
etching the semiconductor substrate through the first opening and the second opening, thereby forming a first trench and a second trench, respectively;
depositing a trench structure material in the first trench and in the second trench, thereby forming a first trench structure and a second trench structure;
providing a second mask on the first mask, wherein the second mask covers the first opening and has a third opening superimposed over the second opening of the first mask, wherein the third opening has a third dimension corresponding to the first dimension and the second dimension, the third dimension being greater than the second dimension;
etching the second trench structure through the second opening of the first mask and through the third opening of the second mask; and
removing the first mask and the second mask.

2. The method of claim 1, wherein the first dimension equals the second dimension, and wherein etching the semiconductor substrate through the first opening and the second opening comprises etching the first trench and the second trench vertically to a first depth.

3. The method of claim 2, wherein etching the second trench structure comprises etching all the trench structure material in the second trench, wherein the method further comprises etching the second trench to a second depth after etching all the trench structure material in the second trench, and wherein the second depth is deeper than the first depth.

4. The method of claim 3, wherein etching the second trench structure comprises using a SiO$_2$ wet etch process or a SiCoNi dry etch process to etch the trench structure material from the second trench.

5. The method of claim 4, wherein etching the second trench to the second depth after etching all the trench structure material in the second trench comprises dry etching the second trench to the second depth.

6. The method of claim 3, further comprising forming a photodiode region adjacent to the second trench in the semiconductor substrate after removing the first mask and the second mask.

7. The method of claim 6, further comprising depositing an isolation layer on the semiconductor substrate and in the second trench after etching the second trench to the second depth.

8. The method of claim 7, further comprising depositing a gate material on the isolation layer and in the second trench after depositing the isolation layer.

9. The method of claim 8, further comprising etching the gate material, thereby forming a gate electrode, wherein the first trench structure is a trench isolation structure and wherein the gate electrode is disposed on an opposite side of the trench isolation structure from a device transistor area of the semiconductor substrate.

10. The method of claim 9, further comprising forming a spacer around the gate electrode on the isolation layer.

11. The method of claim 10, further comprising doping at least one of a pinning layer or a floating diffusion in the semiconductor substrate after forming the spacer.

12. The method of claim 1, further comprising removing at least one of an excess portion of the first trench structure or an excess portion of the second trench structure extending above a surface of the semiconductor substrate after depositing the trench structure material and before providing the second mask.

13. The method of claim 1, wherein the first dimension differs from the second dimension, and wherein etching the semiconductor substrate through the first opening and the second opening comprises etching the first trench to a first depth and etching the second trench to a second depth, wherein the second depth differs from the first depth.

14. The method of claim 13, wherein the first dimension is greater than the second dimension, and wherein the second depth is greater than the first depth.

15. The method of claim 14, further comprising implanting a photodiode region in the semiconductor substrate adjacent to the second trench after removing the first mask and the second mask.

16. The method of claim 15, further comprising depositing an isolation layer on the semiconductor substrate and in the second trench after etching the second trench to the second depth.

17. The method of claim 16, further comprising depositing a gate material on the isolation layer and in the second trench after depositing the isolation layer.

18. The method of claim 17, further comprising etching the gate material, thereby forming a gate electrode, wherein the first trench structure is a trench isolation structure and wherein the gate electrode is disposed on an opposite side of the trench isolation structure from a device transistor area of the semiconductor substrate.

19. The method of claim 18, further comprising forming a spacer around the gate electrode, and doping at least one of a pinning layer or a floating diffusion adjacent to the second trench in the semiconductor substrate after forming the spacer.

20. The method of claim 13, further comprising removing at least one of an excess portion of the first trench structure or an excess portion of the second trench structure extending above a surface of the semiconductor substrate after depositing the trench structure material and before providing the second mask.

* * * * *